(12) United States Patent
Yang et al.

(10) Patent No.: US 8,912,520 B2
(45) Date of Patent: Dec. 16, 2014

(54) NANOSCALE SWITCHING DEVICE

(75) Inventors: Jianhua Yang, Palo Alto, CA (US); Matthew Pickett, San Francisco, CA (US); Gilberto Ribeiro, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 39 days.

(21) Appl. No.: 13/809,498

(22) PCT Filed: Jul. 21, 2010

(86) PCT No.: PCT/US2010/042724
§ 371 (c)(1),
(2), (4) Date: Jan. 10, 2013

(87) PCT Pub. No.: WO2012/011900
PCT Pub. Date: Jan. 26, 2012

(65) Prior Publication Data
US 2013/0112934 A1    May 9, 2013

(51) Int. Cl.
*H01L 29/02* (2006.01)
*H01L 45/00* (2006.01)
*H01L 27/24* (2006.01)

(52) U.S. Cl.
CPC ............ *H01L 45/08* (2013.01); *H01L 27/2463* (2013.01); *H01L 45/146* (2013.01)
USPC ................ 257/2; 257/4; 257/5; 257/E45.002; 257/E45.003

(58) Field of Classification Search
CPC ....... H01L 45/04; H01L 45/08; H01L 45/145; H01L 45/146
USPC .......................... 257/4, 5, E45.002, E45.003
See application file for complete search history.

(56) References Cited

U.S. PATENT DOCUMENTS

| | | |
|---|---|---|
| 2005/0286211 A1 | 12/2005 | Pinnow et al. |
| 2009/0163826 A1 | 6/2009 | Mouttet |
| 2009/0213643 A1 | 8/2009 | Angerbauer et al. |
| 2010/0155686 A1 | 6/2010 | Bratkovski et al. |
| 2011/0182108 A1* | 7/2011 | Williams et al. ............. 365/148 |
| 2013/0037773 A1* | 2/2013 | Strukov et al. .................... 257/2 |

OTHER PUBLICATIONS

International Search Report, Apr. 7, 2011. PCT Application No. PCT/US2010/042724, Filed Jul. 21, 2010.

* cited by examiner

*Primary Examiner* — Daniel Whalen
(74) *Attorney, Agent, or Firm* — Van Cott, Bagley, Cornwall & McCarthy; Steven L. Nichols

(57) ABSTRACT

A nanoscale switching device has an active region disposed between two electrodes of nanoscale widths. The active region contains a switching material that carries mobile ionic dopants capable of being transported over the active region under an electric field to change a resistive state of the device. The switching material further carries immobile ionic dopants for inhibiting clustering of the mobile ionic dopants caused by switching cycles of the device. The immobile ionic dopants have a charge opposite in polarity to the charge of the mobile ionic dopants, and are less mobile under the electric field than the mobile ion dopants.

20 Claims, 5 Drawing Sheets

NANOSCALE SWITCHING DEVICE

STATEMENT REGARDING FEDERALLY SPONSORED RESEARCH OR DEVELOPMENT

This invention has been made with government support awarded by Defense Advanced Research Projects Agency. The government has certain rights in the invention.

BACKGROUND

Nanoscale devices using switching materials such as metal oxides that exhibit resistive switching behavior have recently been reported. The switching behavior of such devices has been linked to the memristor circuit element theory originally predicted in 1971 by L. O. Chua. The discovery of the memristive behavior in the nanoscale switching devices has generated significant interest, and there are substantial on-going research efforts to further develop such nanoscale switches and to implement them in various applications. One of the many important potential applications is to use such switching devices as memory units to store digital data. A memory array may be constructed with such switching devices in a crossbar configuration to provide a very high device density. For memory applications, it is desirable to have nanoscale switching devices with good operation endurance so that they can go through many switching cycles without failure.

BRIEF DESCRIPTION OF THE DRAWINGS

Some embodiments of the invention are described, by way of example, with respect to the following figures.

DETAILED DESCRIPTION

Figure 1:
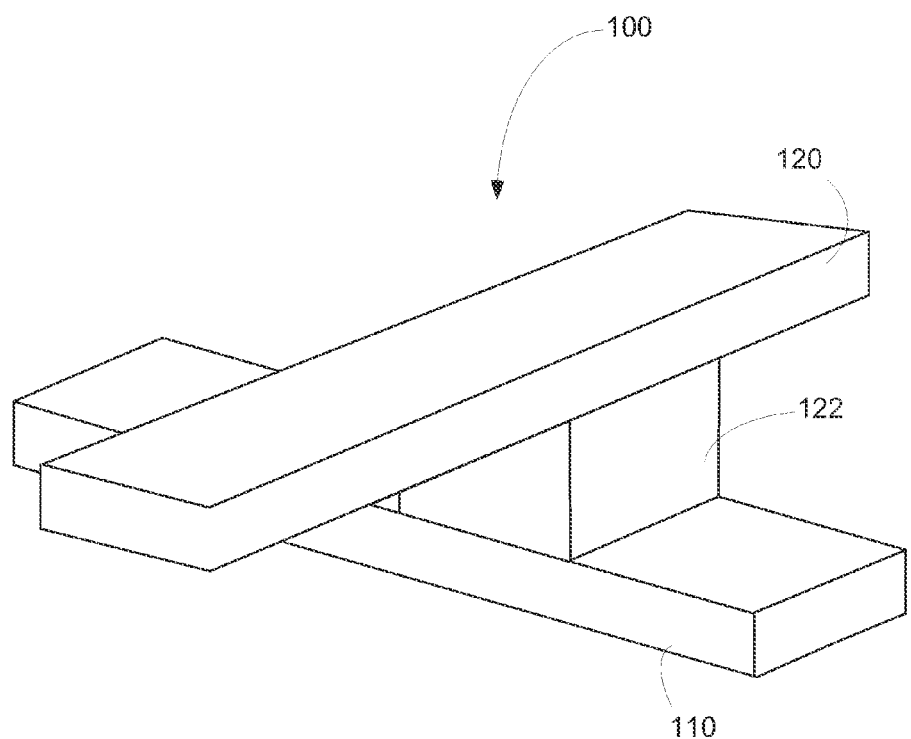
FIG. 1 is a schematic perspective view of a nanoscale switching device in accordance with an embodiment of the invention.

FIG. 1 shows a nanoscale switching device 100 in accordance with an embodiment of the invention. The switching device 100 comprises a bottom electrode 110 and a top electrode 120 extending over the bottom electrode. Disposed between the top and bottom electrodes 120 and 110 is an active region 122 that contains a switching material. The switching material has electrical characteristics that can be controllably modified to allow the device to be switched to ON (low resistance state) and OFF (high resistance state) states. As will be described in greater detail below with reference to FIG. 4, the switching material is provided with a type of immobile ionic dopants that enhances the operation endurance of the switching device 100.

The top and bottom electrodes 120 and 110 may have a width and a thickness on the nanoscale. For example, the electrodes may have a width in the range of 10 nm to 500 nm, and a thickness in the range of 5 nm and 500 nm. Likewise, the active region 122 may have a height that is on the nanoscale and typically from a few nanometers to tens of nanometers or more. As used hereinafter, the term "nanoscale" means the object has one or more dimensions smaller than one micrometer, and in some embodiments less than 500 nanometers and often less than 100 nanometers. The electrodes 120 and 110 are formed of a conductive material, which may be a metal such as platinum, gold, copper, tantalum, tungsten, etc., or doped semiconductor materials, or conductive metal oxides or nitrides. In the embodiment shown in FIG. 1, the top electrode 120 extends at an angle to the bottom electrode 110. The angle may be, for example, around 90 degrees, but may be of other values depending on the device design.

Figure 2:
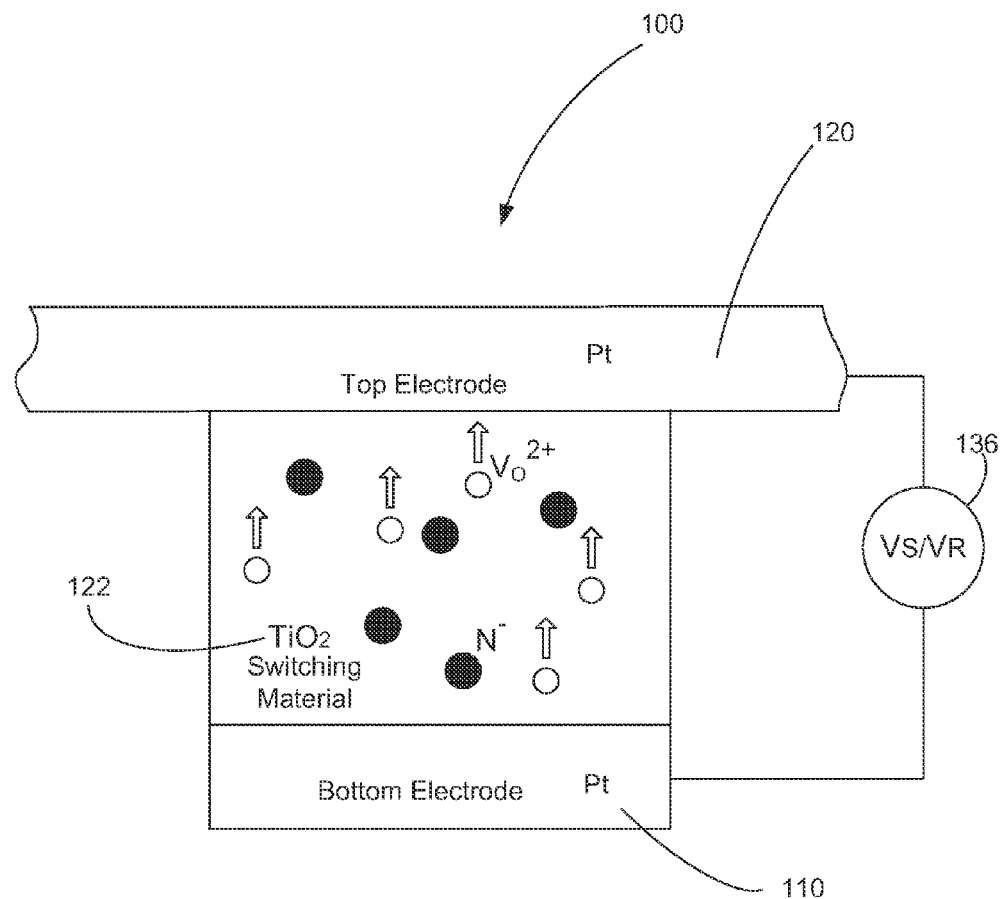
FIG. 2 is a schematic cross-sectional view of a nanoscale switching device in one embodiment of the invention.

Referring now to FIG. 2, the switching material in the active region 122 carries a species of mobile ionic dopants that are responsible for the switching behavior of the device. The mobile ionic dopants can be controllably transported through the switching material and redistributed over the active region 122. The controlled redistribution of the mobile ionic dopants changes the electrical properties of either the switching material or the interface of the switching material and an electrode, which in the illustrated example of FIG. 2 may be the top electrode 120. This ability to change the electrical properties as a function of dopant distribution allows the switching device 100 to be placed in different switching states by applying a switching voltage $V_S$ from a voltage source 136 to the electrodes 120 and 110.

Generally, the switching material may be electronically semiconducting or nominally insulating and a weak ionic conductor. Many different materials with their respective suitable dopants can be used as the switching material. Materials that exhibit suitable properties for switching include oxides, sulfides, selenides, nitrides, carbides, phosphides, arsenides, chlorides, and bromides of transition and rare earth metals. Suitable switching materials also include elemental semiconductors such as Si and Ge, and compound semiconductors such as III-V and II-VI compound semiconductors. The III-V semiconductors include, for instance, BN, BP, BSb, AlP, AlSb, GaAs, GaP, GaN, InN, InP, InAs, and InSb, and ternary and quaternary compounds. The II-VI compound semiconductors include, for instance, CdSe, CdS, CdTe, ZnSe, ZnS, ZnO, and ternary compounds. These listings of possible switching materials are not exhaustive and do not restrict the scope of the present invention.

The dopant species used to alter the electrical properties of the switching material depends on the particular type of switching material chosen, and may be cations, anions or vacancies, or impurities as electron donors or acceptors. For instance, in the case of transition metal oxides such as $TiO_2$, the dopant species may be oxygen vacancies ($V_O^{2+}$). For Si, the dopant could be Li or other mobile species. For GaN, the dopant species may be nitride vacancies or sulfide ion dopants. For compound semiconductors, the dopants may be n-type or p-type impurities.

By way of example, as illustrated in FIG. 2, the switching material may be $TiO_2$, and the mobile ionic dopants may be oxygen vacancies ($V_O^{2+}$). When a DC switching voltage $V_S$ from the voltage source 136 is applied across the top and bottom electrodes 120 and 110, an electric field is created across the active region 122. This electric field, if of sufficient strength and proper polarity, may drive the oxygen vacancies to drift through the switching material in the active region 122 towards the top electrode 120, thereby turning the device into an ON state.

If the polarity of the electric field is reversed, the oxygen vacancies may drift in an opposite direction across the active region 122 and away from the top electrode 120, thereby turning the device into an OFF state. In this way, the switching is reversible and may be repeated. Due to the relatively large electric field needed to cause drifting of the mobile ionic dopants, after the switching voltage is removed, the locations of the dopants remain stable in the switching material. In other words, the switching may be non-volatile.

The state of the switching device 100 may be read by applying a read voltage $V_R$ to the top and bottom electrodes 120 and 110 to sense the resistance across these two electrodes. The read voltage is typically much lower than the switching voltage required to cause drifting of the ionic dopants in the active region 122, so that the read operation does not alter the ON/OFF state of the switching device.

The switching behavior described above may be based on different mechanisms. In one mechanism, the switching behavior may be an "interface" phenomenon. For instance, in the illustrated example of FIG. 2, initially, with a low concentration of oxygen vacancies in the $TiO_2$ switching material near the top electrode 120, the interface of the switching material and the top electrode 120 may behave like a Schottky barrier, with an electronic barrier that is difficult for electrons to go through. Similarly, the interface of the switching material and the bottom electrode 110 may also behave like a Schottky barrier, with a flow direction opposite to that of the Schottky-like barrier at the top electrode 120. As a result, the device has a relatively high resistance in either flow direction. When a switching voltage $V_S$ is applied to the top and bottom electrodes 120 and 110 to turn the device ON, with the top electrode as the negative side, the oxygen vacancies drift towards the top electrodes 120. The increased concentration of dopants near the top electrode 120 changes the electrical property of the interface from one like a Schottky barrier to one like an Ohmic contact, with a significantly reduced electronic barrier height or width. As a result, electrons can tunnel through the interface much more easily, and the switching device 100 is now in the ON state with a significantly reduced overall resistance for a current flowing from the bottom electrode 110 to the top electrode 120.

In another mechanism, the reduction of the resistance of the active region 122 may be a "bulk" property of the switching material. The redistribution of the dopant level in the switching material causes the resistance across the switching material to fall, and this may account for the decrease of the resistance of the device between the top and bottom electrodes 120 and 110. It is also possible that the resistance change is the result of a combination of both the bulk and interface mechanisms. Even though there may be different mechanisms for explaining the switching behavior, it should be noted that the present invention does not rely on or depend on any particular mechanism for validation, and the scope of the invention is not restricted by which switching mechanism is actually at work.

An important technical challenge addressed by the present invention is the need to enhance the endurance of nanoscale switching devices that may go through many cycles of switching operations to turn the device ON and OFF. As explained above, the switching behavior of the switching device is due to the redistribution of the mobile ionic dopants in the switching material. During a switching operation, the mobile ionic dopants are driven by the electric field to migrate and be redistributed over the active region and, as a result, the switching device can be placed in the ON or OFF state, or an intermediate state. It has been discovered by the inventors of the present invention, however, that the mobile ionic dopants have a tendency of clustering or agglomerating as the device goes through write cycles. After multiple switching cycles, the clustering may reach a sufficient level that causes the device to fail.

Figure 3A:
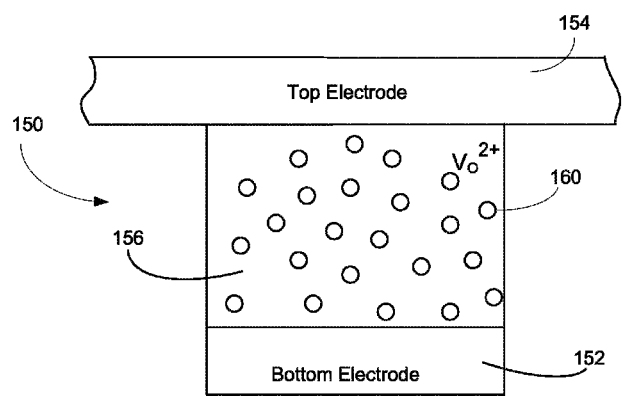
FIGS. 3A and 3B are schematic cross-sectional views of a prior-art nanoscale switching device before and after switching cycles.
Figure 3B:
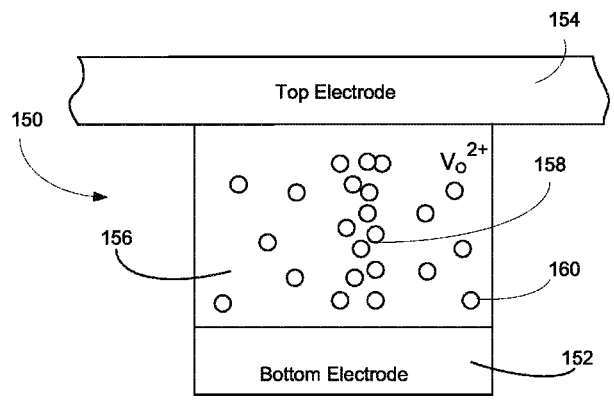

FIGS. 3A and 3B illustrate this issue in a non-limiting fashion with a prior-art nanoscale switching device 150. In this example, the switching material is $TiO_2$, and the mobile ionic dopants 160 are oxygen vacancies ($V_O^{2+}$), which are illustrated schematically in FIGS. 3A and 3B as small open circles. FIG. 3A shows the device 150 after it has been formed but before it has gone through many switching cycles. At this point, the oxygen vacancies are distributed over the active region 156 without significant clustering, even though there may be gradients or small local variations in the distribution. In contrast, FIG. 3B shows the distribution of oxygen vacancies in the active region 156 after the device 150 has gone through many write operations. It has been found that the oxygen vacancies in such as device tend to cluster or agglomerate, to form a very high local concentration of oxygen vacancies. For example, as illustrated in FIG. 3B, the oxygen vacancies may cluster together to form a channel 158 between the top and bottom electrodes 154 and 152. Due to the high concentration of the dopants, the channel 158 of clustered mobile dopants can be highly conductive, and can create a short across the electrodes 154 and 152, thereby rending the device inoperable.

Figure 4:
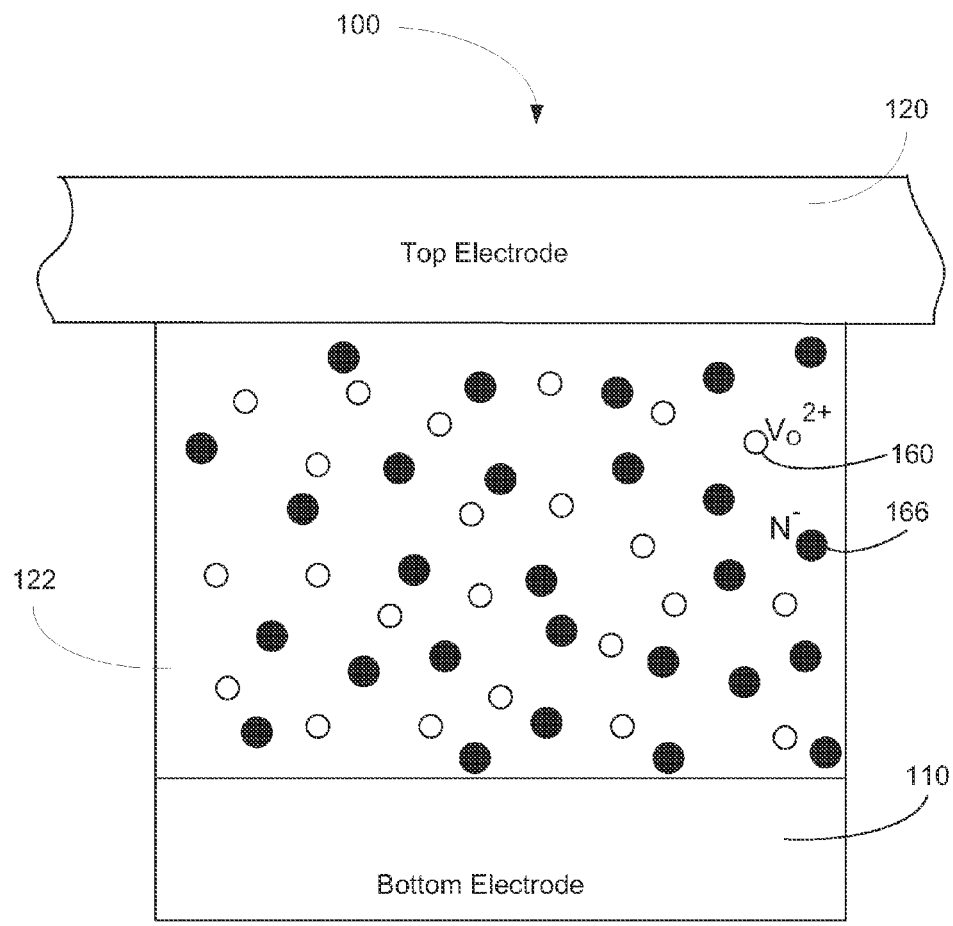
FIG. 4 is a schematic cross-sectional view of a nanoscale switching device of an embodiment of the invention that has immobile ionic dopants for preventing clustering of the mobile ionic dopants responsible for switching.

This issue of clustering of mobile ionic dopants caused by repeated switching operations is effectively solved by the inclusion of a second type of ionic dopants that are "immobile" and charged oppositely to the mobile ionic dopants. As the used herein, the term "immobile" means that the oppositely charged ionic dopants are less mobile than the ionic dopants responsible for the switching behavior. Due to their lower mobility, those immobile dopants are less likely to drift under the normal electric field applied for a switching operation, and tend to remain more or less evenly distributed over the active region even after multiple switching operations. In FIG. 4, the mobile ionic dopants 160 are illustrated as open circles, and the oppositely charged immobile dopants 166 are illustrated as black circles. Due to their charges being opposite in polarity to those of the mobile dopants, the immobile dopants 166 interact with the mobile dopants 160. Because the immobile dopants 166 do not drift under the normal switching voltage, they have a "gettering" effect on the mobile dopants 160 and would inhibit the tendency of the mobile dopants to cluster or agglomerate, by long distance or lateral drift, to a high concentration that could create a shorting path. As a result, the switching device 100 can go through many write cycles without developing a short, and the endurance of the device is significantly improved.

The selection of immobile dopants 166 would depend on the type of mobile dopants 160 responsible for the switching behavior. By way of example, in the case of some metal oxides for which the mobile dopants are oxygen vacancies (Vo2+), the immobile dopants may be negatively charged ions that have a lower mobility than the oxygen vacancies. Such negatively charged ions may be, for example, carbon ions ($C^-$) or nitrogen ions ($N^-$), or other chemically similar species. These types of ions have relatively large diameters and are more difficult to drift or hop through the switching material than the oxygen vacancies. The density of the oppositely charged immobile dopants may be generally on the same order as the density of the mobile dopants for switching, but a wide density range of the immobile dopants may work to prevent clustering of the mobile dopants and provide improved device endurance. The introduction of the immobile ions can be done with a variety of methods, including co-sputtering deposition, doping in chemical vapor deposition, ion implantation, atomic layer deposition, thermal diffusion.

Figure 5:
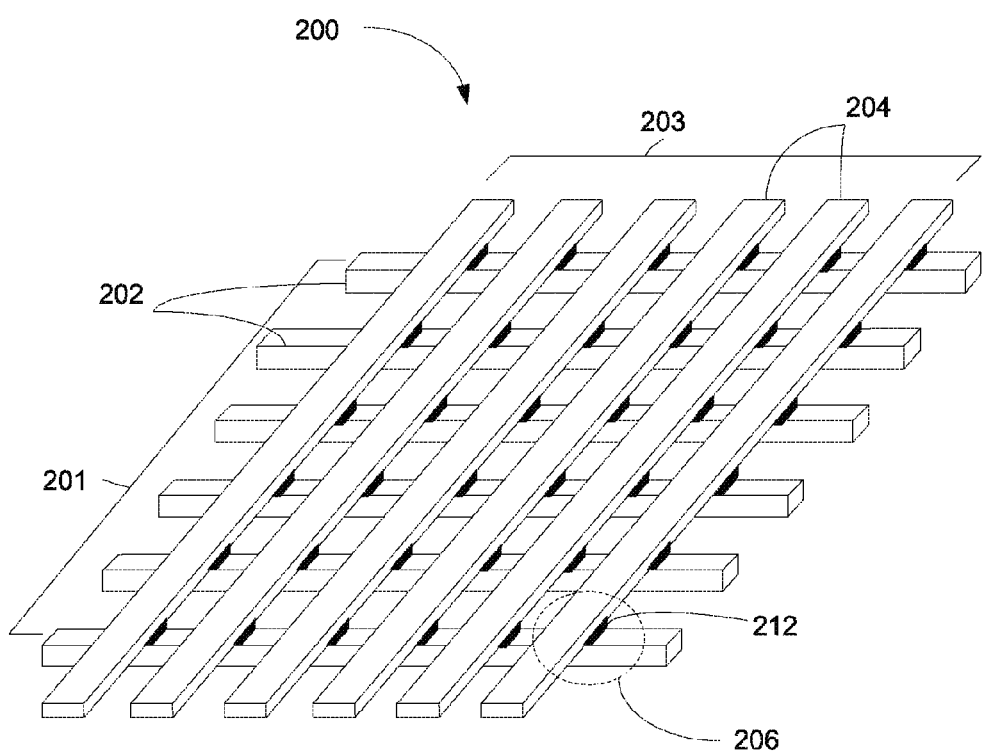
FIG. 5 is a schematic perspective view of an embodiment of a crossbar array of nanoscale switching devices.

The nanoscale switching devices with improved operation endurance may be advantageously used as memory units for data storage. FIG. 5 shows an example of a two-dimensional array 200 of such switching devices. The array has a first group 201 of generally parallel nanowires 202 in a bottom layer, and a second group 203 of generally parallel nanowires 204 in a top layer. The nanowires of the first group 201 run in a first direction, and the nanowires of the second group 203 run in a second direction at an angle, such as 90 degrees, from the first direction. The two layers of nanowires form a two-dimensional crossbar structure, with each nanowire 202 in the first layer intersecting a plurality of the nanowires 204 of the second layer. A two-terminal switching device 206 may be formed at each intersection of the nanowires in this crossbar structure. The switching device 206 has a nanowire 202 of the first group 201 as its bottom electrode, and a nanowire 204 of the second group 203 as its top electrode. An active region 212 containing a switching material is disposed between the top and bottom nanowires 202 and 204. As described above, the switching material contains mobile ionic dopants that can be redistributed under an electric field to alter the resistive state of the device, and immobile ionic dopants charged oppositely to the mobile dopants for preventing clustering of the mobile dopants after multiple switching cycles.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A nanoscale switching device comprising:
a first electrode of a nanoscale width;
a second electrode of a nanoscale width; and
an active region disposed between the first and second electrodes, the active region containing a switching material carrying mobile ionic dopants and immobile ionic dopants, the mobile ionic dopants being of a first charge polarity and capable of being transported through the switching material under an electric field to change a resistive state of the nanoscale switching device, the immobile ionic dopants being of a second charge polarity opposite to the first charge polarity and being less mobile than the mobile ionic dopants under the electric field, wherein the immobile ionic dopants inhibit clustering of the mobile ionic dopants in the active region caused by switching cycles of the nanoscale switching device.

2. A nanoscale switching device as in claim 1, wherein the mobile ionic dopants are oxygen vacancies.

3. A nanoscale switching device as in claim 2, wherein the immobile ionic dopants are selected from carbon and nitrogen.

4. A nanoscale switching device as in claim 2, wherein the switching material is a metal oxide.

5. A nanoscale switching device as in claim 4, wherein the switching material is titanium oxide.

6. A nanoscale switching device as in claim 1, wherein the mobile ionic dopants are positively charged.

7. A nanoscale switching device as in claim 1, wherein the switching material is a semiconductor.

8. A nanoscale switching device as in claim 1, wherein the first and second electrodes are nanowires.

9. A nanoscale crossbar array comprising:
a first group of conductive nanowires running in a first direction;
a second group of conductive nanowires running in a second direction and intersecting the first group of nanowires; and
a plurality of switching devices formed at intersections of the first group of nanowires with the second group of nanowires, each switching device having a first electrode formed by a first nanowire of the first group and a second electrode formed by a second nanowire of the second group, and an active region disposed at the intersection between the first and second electrodes, the active region containing a switching material carrying mobile ionic dopants and immobile ionic dopants, the mobile ionic dopants being of a first charge polarity and capable of being transported through the switching material under an electrical field to change a resistive state of the switching device, the immobile ionic dopants being of a second charge polarity opposite to the first charge polarity and being less mobile than the mobile ionic dopants under the electric field, wherein the immobile ionic dopants inhibit clustering of the mobile ionic dopants in the active region caused by switching cycles of the switching device.

10. A nanoscale crossbar array as in claim 9, wherein the mobile ionic dopants are oxygen vacancies.

11. A nanoscale crossbar array as in claim 10, wherein the immobile ionic dopants are selected from carbon, nitrogen.

12. A nanoscale crossbar array as in claim 10, wherein the switching material is a metal oxide.

13. A nanoscale crossbar array as in claim 12, wherein the switching material is titanium oxide.

14. A nanoscale crossbar array as in claim 9, wherein the mobile ionic dopants are positively charged.

15. A nanoscale crossbar array as in claim 9, wherein the switching material is a semiconductor.

16. A nanoscale switching device comprising:
a first electrode;
a second electrode; and
an active region disposed between the first and second electrodes, the active region containing a switching material having therein a first ionic dopant and a second, different ionic dopant,
the first ionic dopant being a mobile dopant of a first charge polarity so as to move through the switching material in response to application of an electric field to change a resistive state of the nanoscale switching device,
the second ionic dopant being of a second charge polarity opposite to the first charge polarity and being less mobile than the first ionic dopant under the electric field,
wherein the second ionic dopant inhibits clustering of the first ionic dopant in the active region caused by switching cycles of the nanoscale switching device.

17. A nanoscale switching device as in claim 16, wherein the first ionic dopant comprises oxygen vacancies.

18. A nanoscale switching device as in claim 17, wherein the second ionic dopant is one of: carbon and nitrogen.

19. A nanoscale switching device as in claim 16, wherein the switching material is a metal oxide.

20. A nanoscale switching device as in claim 16, wherein the switching material is a semiconductor.

* * * * *